(12) United States Patent
Watanabe

(10) Patent No.: US 8,134,633 B2
(45) Date of Patent: Mar. 13, 2012

(54) COLOR SOLID-STATE IMAGE CAPTURING APPARATUS AND ELECTRONIC INFORMATION DEVICE

(75) Inventor: Takashi Watanabe, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 622 days.

(21) Appl. No.: 12/232,953

(22) Filed: Sep. 26, 2008

(65) Prior Publication Data

US 2009/0128672 A1    May 21, 2009

(30) Foreign Application Priority Data

Sep. 28, 2007    (JP) ................. 2007-256195

(51) Int. Cl.
*G02B 13/16*    (2006.01)
*H04N 5/225*    (2006.01)

(52) U.S. Cl. ........ 348/335; 348/340; 348/345; 348/272; 348/273

(58) Field of Classification Search .................. 348/335, 348/340, 345, 272, 273
See application file for complete search history.

(56) References Cited

U.S. PATENT DOCUMENTS

| 6,476,851 B1 * | 11/2002 | Nakamura .................. 348/65 |
| 2009/0034083 A1 * | 2/2009 | Li et al. ................... 359/619 |

FOREIGN PATENT DOCUMENTS

| JP | 2005-234038 | 9/2005 |
| JP | 2006-086356 | 3/2006 |

* cited by examiner

*Primary Examiner* — Yogesh Aggarwal
(74) *Attorney, Agent, or Firm* — Edwards Wildman Palmer LLP

(57) ABSTRACT

A color solid-state image capturing apparatus is provided, where a plurality of light receiving sections are arranged on a light receiving surface of an image capturing area, a plurality of color filters are positioned in a constant period above the plurality of light receiving sections, and a plurality of microlenses for focusing light on the plurality of respective light receiving sections are positioned on the plurality of color filters, and a plurality of color signals are output in accordance with the plurality of color filters, where the constant period of the plurality of color filters is defined as a unit, and the size of the plurality of microlenses is variable for each light receiving section so that the ratio of the plurality of color signals is constant in the unit.

15 Claims, 5 Drawing Sheets

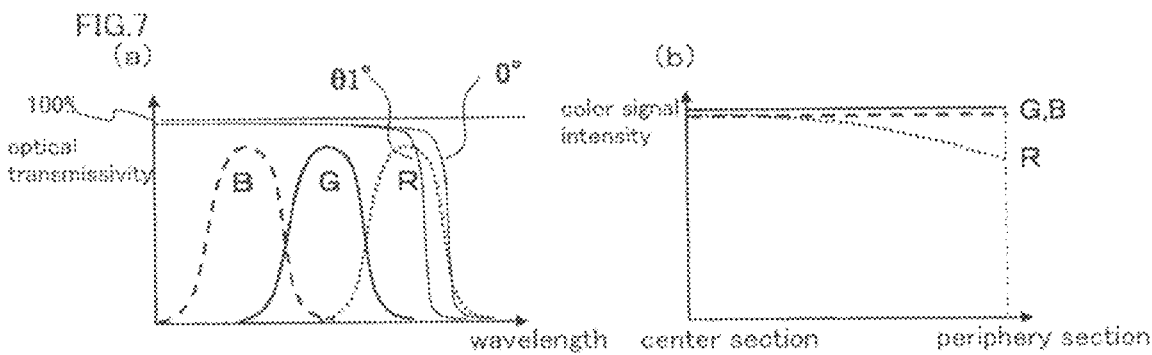
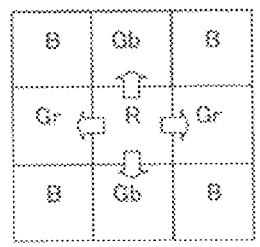 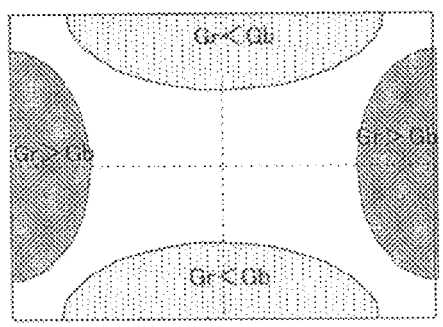

COLOR SOLID-STATE IMAGE CAPTURING APPARATUS AND ELECTRONIC INFORMATION DEVICE

This nonprovisional application claims priority under 35 U.S.C. §119(a) to Patent Application No. 2007-256195 filed in Japan on Sep. 28, 2007, the entire contents of which are hereby incorporated by reference.

BACKGROUND OF THE INVENTION

1. Field of the Invention

The present invention relates to a color solid-state image capturing apparatus having a photoelectric conversion section (which is defined as a light receiving section corresponding to each pixel) configured with a semiconductor element (photodiode), which performs photoelectric conversions on and capturing incident light from a subject for each pixel, and a plurality of microlenses for focusing incident light through corresponding color filters of respective colors on corresponding light receiving sections; and an electronic information device, such as a digital camera (e.g., digital video camera and digital still camera), an image input camera, a scanner, a facsimile machine, and a camera-equipped cell phone device used in an image capturing section as an image input device.

2. Description of the Related Art

A conventional color solid-state image capturing apparatus includes a plurality of light receiving sections formed on a light receiving surface of an image capturing area, the light receiving sections being arranged with a plurality of photoelectric conversion sections in two dimensions (transverse and longitudinal directions) corresponding to respective pixels. A light signal entering each of the light receiving sections is converted into an electric signal at each light receiving section. A single-plate color solid-state image capturing apparatus is known, in which color filters of respective colors are repetitively arranged with a constant space period on each light receiving section, thereby obtaining a plurality of color signals (e.g., color signals of three primary colors of R, G and B) by one image capturing apparatus. In particular, with the advancement of the miniaturization of the pixel size, a structure formed with a plurality of microlenses for focusing light in a corresponding manner to each light receiving section is widely used in order to increase the efficiency of light entering to each light receiving section.

In such a conventional color solid-state image capturing apparatus, the response for each color in each light receiving section is not constant due to various reasons, causing inequality of the response. As a result, a color shading occurs in the periphery of the light receiving surface in the image capturing area. As a well known example with the use of an interference-type infrared rays cut filter with a dielectric multilayer film, as the position (distance) moves further away from the center section of the light receiving surface of the image capturing area to the outside, an infrared cut wavelength shifts to the short wavelength side and a red color signal decreases, causing the periphery of the light receiving surface of the image capturing area to be blue.

Thus, the fact that the red color signal decreases at the periphery section of the image capturing area to be turned to a blue color, is disclosed in Reference 1 and will be described in detail with reference to FIGS. 5(a) and 5(b).

FIG. 5(a) is a schematic view illustrating a structure of a section of the conventional color image-capturing system disclosed in Reference 1. FIG. 5(b) is a schematic view illustrating a plan structure of a light receiving surface of an image sensor in FIG. 5(a).

In FIG. 5(a), a color image capturing system 100 includes: an image sensor 101 for capturing incident light; a package 102 for accommodating the image sensor 101 within; a lid glass 103 provided on the light entering side of the image sensor 101 inside the package 102; an infrared rays cut filter 104 formed by a dielectric multilayer film provided on the lid glass 103; and an image forming lens 105 for forming an image on a light receiving surface of an image capturing area of the image sensor 101, provided above the infrared rays cut filter 104.

An optical axis C of the image forming lens 105 passes the center section of a light receiving surface (image capturing area) of the image sensor 101, and a light incident angle θ in the optical axis C is 0 degree. The incident angle θ increases from the center section of the light receiving area (image capturing area) to a periphery section (circumference section), and the incident angle becomes a maximum value θ1 at the outer circumference edge section (corner section). FIG. 5(b) illustrates such increase of the incident angle. In FIG. 5(b), the maximum value θ1 is the incident angle θ corresponding to a rectangular corner section 101a of a light receiving surface 101A (image capturing area) of the image sensor 101 farthest from the optical axis C at the center section of the light receiving surface 101A (image capturing area) of the image sensor 101. Herein, the position of a concentric circle having the optical axis C as the center of the light receiving surface 101A shows the positions having the same distance from the optical axis C.

On the other hand, it is needless to say that a conventional solid-state image capturing device with a higher resolution is preferable. It is known that the resolution is improved by increasing the brightness signal. As a result, there is a demand for improving the brightness signal.

The brightness signal can be obtained by a predetermined equation with values of respective color signals as variables. The equation for obtaining the brightness signal uses one of the values of respective color signals as a maximum component. Thus, it is effective to increase the color signal having the maximum component that significantly contributes to the brightness signal in order to increase the brightness signal. For example, in accordance with a common standard, or the NTSC standard, a brightness signal Ey is defined by an equation $Ey=0.59Eg+0.3Er+0.11Eb$. Herein, Eg is a signal component of green (G), Er is a signal component of red (R), and Eb is a signal component of blue (B). As described above, the contribution of the signal component of green (G) is large in the brightness signal. Therefore, it is more effective to increase the signal component of Eg than to increase signals of other colors in the NTSC standard so as to increase the brightness signal.

As described above, the brightness signal uses one of the plurality of color signals as the maximum component. As a conventional technique for increasing a color signal of the maximum component in order to increase the brightness signal, Reference 2 will be described in detail with reference to FIG. 6.

FIG. 6 is a main part cross sectional view of a conventional solid-state image capturing device disclosed in Reference 2. Herein, a transfer gate wiring and a control gate wiring will be omitted in order to avoid the complexity of the description.

In FIG. 6, a conventional solid-state image capturing device 200 is provided with a plurality of embedded type photodiodes 202, which functions as a light receiving section, in two dimensions on an n-type silicon substrate 201. The embedded type photodiode 202 is provided with a predetermined area for receiving light by a vertical signal line and an opening 204 of a control area wiring 203. Although not illustrated in the figure, the embedded type photodiode 202 is composed of an n-type area surface diffusion section provided on a surface of the n-type silicon substrate 201 and a p-type charge accumulation area provided further inside the n-type silicon substrate 201.

Above each of the embedded type photodiodes 202, a color filter 205 of any one of color layers of R, G and B is positioned in an on-chip state above an insulation film 206. Note that the Bayer arrangement is adopted as a color arrangement for the color filter 205. The color filter 205 has the same width W-4 and the same area for each R, G and B. The color filter 205 is positioned in a corresponding manner to the embedded type photodiode 202 for performing photoelectric conversions. As a result, incident light is led to the embedded type photodiodes 202 subsequent to passing through the color filter 205.

Above the color filter 205, a microlens 207 is positioned in a corresponding manner to the color filter 205, in an on-chip state above a planarization film 208. The microlens 207 is positioned in a corresponding manner to the color filter 205. The color filter 205 is positioned in a corresponding manner to the embedded type photodiodes 202 as described above. Thus, the microlens 207 is positioned substantially in a corresponding manner to the embedded type photodiodes 202.

The microlens 207 has a different diameter depending on a color layer of the corresponding color filter 205. Herein, the diameter W-1 of a microlens 205G positioned in a corresponding manner to a color filter 205G of a color layer of G (green) is comparatively larger than a diameter W-2 of other microlenses 205R and 205B. Thus, the pixel for obtaining a G signal has more light focusing ratio than pixels of other colors, thereby increasing the amount of the incident light. Accordingly, the intensity of the output signal of the G signal increases.

Note that the conventional solid-state image capturing device 200 adopts the NTSC standard. In the NTSC standard, the G signal of green color is the maximum component of the brightness signal. Therefore, as described above, the resolution of the conventional solid-state image capturing device 200 increases as the maximum component of the brightness signal increases.

In the conventional solid-state image capturing device 200, a microlens 207G, which corresponds to a color layer 205G of a green color filter functioning as an intense brightness color layer, has a larger opening area than a microlens 207R or 207B which corresponds to other color layers. Herein, the diameter of the microlens 207G corresponding to the intense brightness color layer is increased more than that of conventional microlenses. Therefore, the intensity of the G signal due to the intense brightness color layer increases.

However, the area for elements is limited. As the microlens 207G becomes larger, the microlenses 207R and 207B, which correspond to other color layers, will become smaller accordingly. However, the diameter W-2 of the microlenses 207R and 207B is larger than the opening width W-3 of the control area wiring 203. As a result, pixels corresponding to dim brightness color layers will have an improved light focusing ratio by positioning the microlenses 207R and 207B.

Although the diameter W-2 of the microlenses 207R and 207B becomes smaller, the ratio of the signal of the intense brightness color layers will increase relative to the signal of the dim brightness color layers. As a result, the brightness signal can be increased and the resolution can be improved by calculation and correction outside the solid-state image capturing device.

Reference 1: Japanese Laid-Open Publication No. 2005-234038
Reference 2: Japanese Laid-Open Publication No. 2006-86356

SUMMARY OF THE INVENTION

According to the configuration of Reference 1 described above, an infrared cut wavelength that has passed though the infrared rays cut filter 104 formed by a dielectric multilayer film shifts to the short wavelength side as the light incident angle θ increases, namely as the position (distance) moves further away from the center section of the light receiving surface 101A of the image capturing area to the circumference portion. Such a shift is illustrated in FIG. 7(a). In addition, FIG. 7(a) illustrates spectral transmittance characteristics of color filters R (red), G (green) and B (blue). As a result, the color signal of the R pixel decreases in the periphery section of the light receiving surface 101A of the image capturing area. That is, the intensity of the red color signal decreases more from the optical axis C (center) of the center section of the light receiving surface 101A of the image capturing area to the periphery section concentrically, causing a color shading to turn to the blue color side. This is illustrated in FIG. 7(b). The color signal intensity is corrected by white balance such that the color signal intensity will be the same at the center section.

That is, a color solid-state image capturing apparatus using a plurality of color filters conventionally uses an infrared cut filter so as to control unnecessary sensitivity in the infrared area. The cut wavelength of the infrared cut filter defines the limit of the long wavelength side of the red filter. Normally, an interference filter formed by a dielectric multilayer film is used for the controlling. The cut wavelength of the interference filter shifts to the short wavelength side (shifts to the left side) (e.g., from 0 degree to θ 1 degree in FIG. 7(a)) when the angle of the incident light deviates from the perpendicular 0 degree. On the contrary, the incident light from the image forming lens to the light receiving section becomes an oblique light from the perpendicular 0 degree to the θ 1 degree as the maximum value as the incident light deviates from the optical axis (perpendicular 0 degree). As a result, the amount of the signal of the red pixel decreases more towards the periphery section of the light receiving surface of the image capturing area. Due to this, an intense color shading occurs where the red signal turns to be more blue as the position moves towards the periphery section of the display screen.

FIG. 8(b) illustrates another exemplary color shading phenomenon. The color arrangement of the color filters in this case is known to be Bayer arrangement as illustrated in FIG. 8(a). That is, according to the Bayer arrangement, three colors of R (red), Gr (green in an R row), Gb (green in a B row) and B (blue) are repetitively arranged in a four pixel period of 2×2. R light enters deep inside the silicon, and therefore, the R light has a large influence on the peripheral pixels. In particular, in the left and right edge sections of the light receiving surface, the R light has a large influence on the Gr pixels adjacent to the left and right. Similarly, in the upper and lower sections of the light receiving surface, the R light has a large influence on the Gb pixels adjacent to the top and bottom. Consequently, "Gr" and "Gb" will be unbalanced, which are originally supposed to be balanced. FIG. 8(b) illustrates such a phenomenon using an image capturing screen when the light is evenly irradiated.

On the other hand, according to the configuration of Reference 2 described above, the diameter of a microlens corresponding to a color layer (green color layer) positioned at a pixel for generating a maximum component of the brightness signal, is configured to be uniformly larger than the diameter of a microlens corresponding to color layers (red color layer and blue color layer) positioned at other pixels in the entire light receiving surface. However, such a configuration is not able to deal with the positioning of the infrared rays cut filter 104 formed by a dielectric multilayer film, according to Reference 1 described above, or the color shading phenomenon caused by a specific color arrangement of color filters, or such a configuration is not intended to deal with such color shading phenomenon.

The present invention is intended to solve the conventional problems described above. The objective of the present invention is to provide a color solid-state image capturing apparatus, which is capable of suppressing a color shading phenomenon of a specific shape (correcting non-uniformity of color signals) caused by various factors such as the positioning of the infrared cut filter and a specific color arrangement of color filters, and an electronic information device, such as a camera-equipped cell phone device, using the color solid-state image capturing apparatus as an image input device in an image capturing section.

A color solid-state image capturing apparatus according to the present invention is provided, in which a plurality of light receiving sections for performing photoelectric conversions are arranged in a matrix on a light receiving surface of an image capturing area, a plurality of color filters each having a different spectral characteristic are positioned in a constant period above the plurality of light receiving sections in a corresponding manner to each of the plurality of light receiving sections, and a plurality of microlenses for focusing light on the plurality of respective light receiving sections are positioned on the plurality of color filters, and a plurality of color signals are output in accordance with the plurality of color filters, wherein the constant period of the plurality of color filters is defined as a unit, and the size of the plurality of microlenses is variable for each light receiving section so that the ratio of the plurality of color signals is constant in the unit, thereby achieving the objective described above. Preferably, in a color solid-state image capturing apparatus according to the present invention, the plurality of light receiving sections each have the same area in a plan view and are arranged with an equal pitch in a horizontal direction and a perpendicular direction on the light receiving surface of the image capturing area.

Still preferably, in a color solid-state image capturing apparatus according to the present invention, the ratio of the plurality of color signals is red (R)/green (G), green (G)/blue (B), and blue (B)/red (R), and the ratio is constant in the entire image capturing area.

Still preferably, in a color solid-state image capturing apparatus according to the present invention, the plurality of color filters have a color arrangement of primary colors.

Still preferably, in a color solid-state image capturing apparatus according to the present invention, the plurality of color filters are composed of the primary colors of red (R), green (G) and blue (B).

Still preferably, in a color solid-state image capturing apparatus according to the present invention, the color arrangement of primary colors is Bayer arrangement.

Still preferably, in a color solid-state image capturing apparatus according to the present invention, an infrared cut filter is provided above the light receiving surface of the image capturing area, and the size or light focusing ratio of the microlens corresponding to a red filter among the plurality of color filters is increased successively or incrementally.

Still preferably, in a color solid-state image capturing apparatus according to the present invention, when the size of all the plurality of microlenses is equal and the ratio of the plurality of color signals is not constant producing $F_{ij}(x, y) = C_i(x, y)/C_j(x, y)$ as a distribution, the size of the microlens for each light receiving section is defined to be the size in proportion to $1/F_{ij}(x, y)$, and $(x, y)$ denotes unit x, y coordinates of the space period of the color filter, and i and j denotes numbers to express the type of the color filter.

Still preferably, in a color solid-state image capturing apparatus according to the present invention, the plurality of microlenses each have a partially spherical shape.

Still preferably, in a color solid-state image capturing apparatus according to the present invention, at least adjacent sections of circumference edge sections of adjacent microlenses overlap each other at the circumference in at least a periphery section of the light receiving surface among from the center section of the light receiving surface to the periphery section of the light receiving surface.

Still preferably, in a color solid-state image capturing apparatus according to the present invention, the size or light focusing ratio of the microlens corresponding to a green Gb pixel filter among the plurality of color filters is successively or incrementally increased from a portion of the center section in a top and bottom direction of the light receiving surface to a left edge section and a right edge section, so that at least portions of respective adjacent lens periphery sections touch each other, and the size or light focusing ratio of the microlens corresponding to a green Gr pixel filter among the plurality of color filters is successively or incrementally increased from a portion of the center section in a left and right direction of the light receiving surface to an upper edge section and a lower edge section, so that at least portions of respective adjacent lens periphery sections touch each other. In addition, preferably, in a color solid-state image capturing apparatus according to the present invention, Gr filters are adjacent to the left and right sides of an R filter and Gb filters are adjacent to the upper and lower sides of the R filter in the color filters of Bayer arrangement, and the size or light focusing ratio of the microlens corresponding to a green Gb pixel filter among the plurality of color filters is successively or incrementally increased from a portion of the center section in a top and bottom direction of the light receiving surface to a left edge section and a right edge section, so that at least portions of respective adjacent lens periphery sections touch each other, and the size or light focusing ratio of the microlens corresponding to a green Gr pixel filter among the plurality of color filters is successively or incrementally increased from a portion of the center section in a left and right direction of the light receiving surface to an upper edge section and a lower edge section, so that at least portions of respective adjacent lens periphery sections touch each other. In such cases, G filters adjacent left and right of an R filter expand at the left and right edges of the light receiving surface, and G filters adjacent top and bottom of an R filter expand at the upper and lower edges of the light receiving surface. However, Gr and Gb may be optionally at the either position (may change places with each other).

Still preferably, in a color solid-state image capturing apparatus according to the present invention, an infrared cut filter is provided above the light receiving surface of the image capturing area, and the size or light focusing ratio of the microlens corresponding to a red filter among the plurality of color filters is increased successively or incrementally from the center section of the light receiving surface towards the outside, wherein the size or light focusing ratio of the microlens corresponding to a green Gb pixel filter among the plurality of color filters is increased successively or incrementally from a portion of the center section in a top and bottom direction of the light receiving surface to a left edge section and a right edge section, so that at least portions of adjacent lens circumference sections touch each other, and wherein the size or light focusing ratio of the microlens corresponding to a green Gr pixel filter among the plurality of color filters is increased successively or incrementally from a portion of the center section in a left and right direction of the light receiving surface to an upper edge section and a lower edge section, so that at least portions of adjacent lens circumference sections touch each other. In addition, preferably, in a color solid-state image capturing apparatus according to the present invention, an infrared cut filter is provided above the light receiving surface of the image capturing area, Gr filters are adjacent to the left and right sides of an R filter and Gb filters are adjacent to the upper and lower sides of the R filter in the color filters of Bayer arrangement, and the size or light focusing ratio of the microlens corresponding to a red filter among the plurality of color filters is increased successively or incrementally from the center section of the light receiving surface towards the outside, wherein the size or light focusing ratio of the microlens corresponding to a green Gb pixel filter among the plurality of color filters is increased successively or incrementally from a portion of the center section in a top and bottom direction of the light receiving surface to a left edge section and a right edge section, so that at least portions of adjacent lens circumference sections touch each other, and wherein the size or light focusing ratio of the microlens corresponding to a green Gr pixel filter among the plurality of color filters is increased successively or incrementally from a portion of the center section in a left and right direction of the light receiving surface to an upper edge section and a lower edge section, so that at least portions of adjacent lens circumference sections touch each other. In such cases, G filters adjacent left and right of an R filter expand at the left and right edges of the light receiving surface, and G filters adjacent top and bottom of an R filter expand at the upper and lower edges of the light receiving surface. However, Gr and Gb may be optionally at the either position (may change places with each other).

Still preferably, in a color solid-state image capturing apparatus according to the present invention, the expansion ratio of the size of the microlens is set to be a value for correcting the decreased amount of the light amount of a specific color or the decreased amount of a specific color signal intensity from the center section of the light receiving surface towards the outside.

Still preferably, in a color solid-state image capturing apparatus according to the present invention, a unit shape of the microlens in a plan view is either of a circle, ellipse, rectangle or square.

Still preferably, in a color solid-state image capturing apparatus according to the present invention, the color solid-state image capturing apparatus configures a CMOS image sensor or a CCD image sensor.

An electronic information device according to the present invention uses the color solid-state image capturing apparatus according to the present invention as an image input device in an image capturing section.

The functions of the present invention having the structures described above will be described hereinafter. It is possible to correct the variation of the ratio of respective signals within a unit, which is a cause of the color shading, by changing the dimension (size) of the microlens to adjust the light focusing amount. As a result, it is possible to obtain an image without a color shading phenomenon of a specific shape caused by various factors such as the positioning of the infrared cut filter and a specific color arrangement of color filters. That is, the size of the microlens can be successively corrected in such a manner to negate the predicted non-uniformity of color signals in advance for the color shading phenomenon of a specific shape caused due to various factors.

Conventionally, a color solid-state image capturing apparatus using a plurality of color filters uses an infrared cut filter in order to control an unnecessary sensitivity in the infrared area. However, the amount of a signal of a red pixel decreases towards the periphery section of the light receiving surface of the image capturing area, and as a result, an intense color shading occurs, where the signal turns to the blue side towards the periphery section of the display screen.

Therefore, when the infrared cut filter is positioned, an infrared cut wavelength of a dielectric multilayer film shifts towards the short wavelength side as the incident angle of light increases. As a result, the size (or light focusing ratio) of the microlens of the light receiving surface is corrected in an enlarging manner as the position moves further away from the center section of the light receiving surface of the image capturing area to the periphery section of the light receiving surface, thereby suppressing a color shading to turn blue in the periphery section of the light receiving surface.

Further, according to a specific color arrangement of color filters, such as Bayer arrangement, an influence to adjacent Gr pixels on the left and right is significant in the left and right edge sections of the light receiving surface of the image capturing area and the color signal intensity of the Gb pixel decreases, and an influence to adjacent Gb pixels on the top and bottom is significant in the upper and lower edge sections of the light receiving surface of the image capturing area and the color signal intensity of the Gr pixel decreases, thereby causing an unbalance to the green color of "Gr" and "Gb", which are supposed to be equal. However, a correction is made by successively or incrementally increasing the size (or light focusing ratio; the size being a diameter or area) of a microlens corresponding to the Gb pixel color filter of a green color among a plurality of color filters as the position shifts from the center section of the light receiving surface of the image capturing area to the left or right edge portion in a horizontal direction (row direction or transverse direction) as well as successively or incrementally increasing the size (or light focusing ratio; the size being a diameter or area) of a microlens corresponding to the Gr pixel color filter of a green color among the plurality of color filters as the position shifts from the center section of the light receiving surface of the image capturing area to the upper edge or lower edge portion in a perpendicular direction (column direction or longitudinal direction). As a result, a color shading caused by a specific color arrangement of color filters is corrected, thereby obtaining a uniform image.

When a specific shape, namely a color shading of Fij (x, y) occurs, it is possible to correct the color shading by changing the size of the microlens to the size in proportion to 1/Fij (x, y). As a result, the color shading is suppressed.

It is an effective condition for preventing the color shading to arrange a plurality of light receiving sections each in the same area in a plan view with equal pitch in a horizontal direction as well as a perpendicular direction.

When the color signals are of three primary colors of R, G and B, signal processing in the following steps will be easier compared to a color arrangement of complementary colors. In addition, when it is Bayer arrangement, the unit color signals will be R, B, Gb and Gr, and therefore, the G color occupies half of the color arrangement, thereby obtaining high color resolution.

When each microlens has a partially spherical shape, such a spherical shape has a higher light focusing efficiency of a microlens compared to other lens shapes. Therefore, it is possible to prevent the decrease of the light focusing ratio due to the variation in size of the microlens.

According to the present invention with the configuration described above, a fixed period of a plurality of color filters is defined as a unit. A size (or light receiving ratio; in proportion to diameter or area) of a plurality of microlenses is variable for each light receiving section such that the ratio of a plurality of color signals will be constant within the unit. As a result, the color shading phenomenon of a specific shape, which is caused by various factors such as the positioning of the infrared cut filter and the specific color arrangement of color filters, can be suppressed.

These and other advantages of the present invention will become apparent to those skilled in the art upon reading and understanding the following detailed description with reference to the accompanying figures.

BRIEF DESCRIPTION OF THE DRAWINGS

FIGS. 7(a) and 7(b) are diagrams illustrating the problem to be solved of the conventional color image-capturing system illustrated in FIG. 5.

FIGS. 8(a) and 8(b) are diagrams illustrating the color shading phenomenon of the conventional color solid-state image capturing apparatus.

Figure 1:
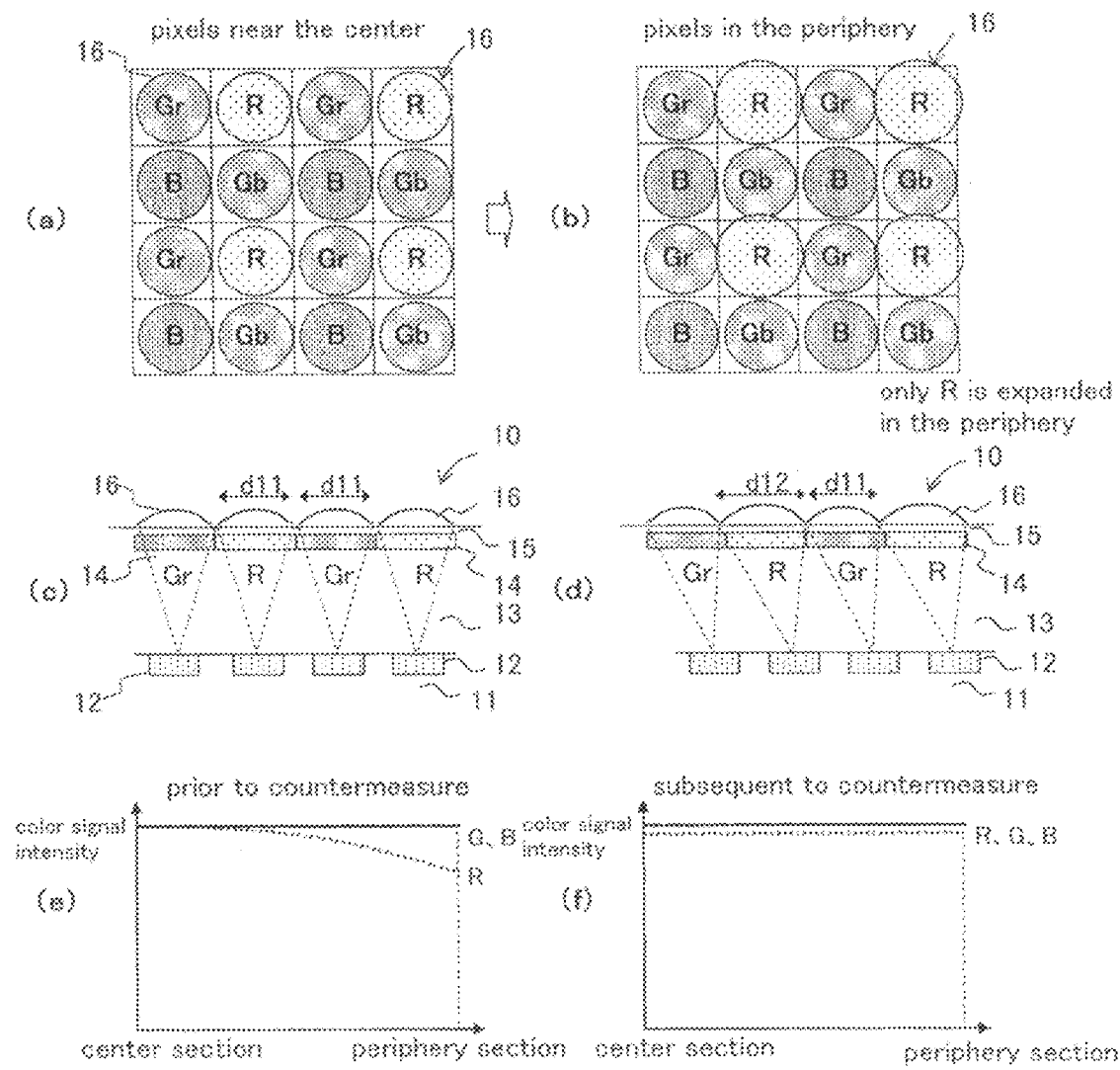
FIGS. 1(a) and 1(b) are plan views schematically illustrating Embodiment 1 of the color solid-state image capturing apparatus of the present invention.
FIGS. 1(c) and 1(d) are cross sectional views schematically illustrating the color solid-state image capturing apparatus.
FIGS. 1(e) and 1(f) are distribution charts of a color signal intensity prior and subsequent to the countermeasure according to Embodiment 1.

10, 10A, 10B color solid-state image capturing apparatus
11 semiconductor substrate
12 photoelectric conversion section (light receiving section)
14 color filter
16 to 18 microlens
20 electronic information device
30 memory section
40 display section
50 communication section
60 image output section
102 package
103 lid glass
104 infrared cut filter
105 image focusing lens
C optical axis
d11, d12, d21, d22, d23 size of microlens (diameter)

DESCRIPTION OF THE PREFERRED EMBODIMENTS

Hereinafter, Embodiments 1 to 3 of the color solid-state image capturing apparatus according to the present invention, Embodiment 4 for a case where the color solid-state image capturing apparatus is applied for a CMOS image sensor or a CCD image sensor, and Embodiment 5 of an electronic information device using any of the image sensors as an image input device in an image capturing section will be described with reference to the accompanying figures.

Embodiment 1

FIG. 1(a) is a plan view of microlenses corresponding to respective colors near the center section of a light receiving surface as an exemplary essential configuration of Embodiment 1 of the color solid-state image capturing apparatus according to the present invention. FIG. 1(b) is a plan view of microlenses corresponding to respective colors near the periphery section of the light receiving surface. FIG. 1(c) is a longitudinal cross sectional view in a horizontal direction of FIG. 1(a). FIG. 1(d) is a longitudinal cross sectional view in a horizontal direction of FIG. 1(b). FIG. 1(e) is a distribution chart of a color signal intensity prior to the countermeasure according to Embodiment 1. FIG. 1(f) is a distribution chart of a color signal intensity subsequent to the countermeasure according to Embodiment 1.

In FIGS. 1(a) to 1(d), a color solid-state image capturing apparatus 10 according to Embodiment 1 is provided with a plurality of photoelectric conversion sections 12 (light receiving section or light receiving element) of an N-type region with a predetermined space in a two dimensional matrix, in a P-type well region (not shown) provided on an N-type semiconductor substrate 11. Thus, the plurality of photoelectric conversion sections 12 are arranged having the same shape in a plan view and the same area, with an equal pitch in a horizontal direction and a vertical direction (row and column directions) in the entire light receiving surface of an image capturing area. A surface P+ layer (not shown) for preventing dark current is provided on the surface of the photoelectric conversion section 12 (light receiving section or light receiving element), and a light receiving element (photodiode) has an embedded structure. A color filter 14 and a microlens 16 on a planarization film 15 are provided in a corresponding manner to each photoelectric conversion section 12 via an interlayer insulation film 13 on each of the photoelectric conversion sections 12. Incident light is focused on each of the photoelectric conversion sections 12 from each microlens 16 via a color filter 14 of each color.

Figure 5:
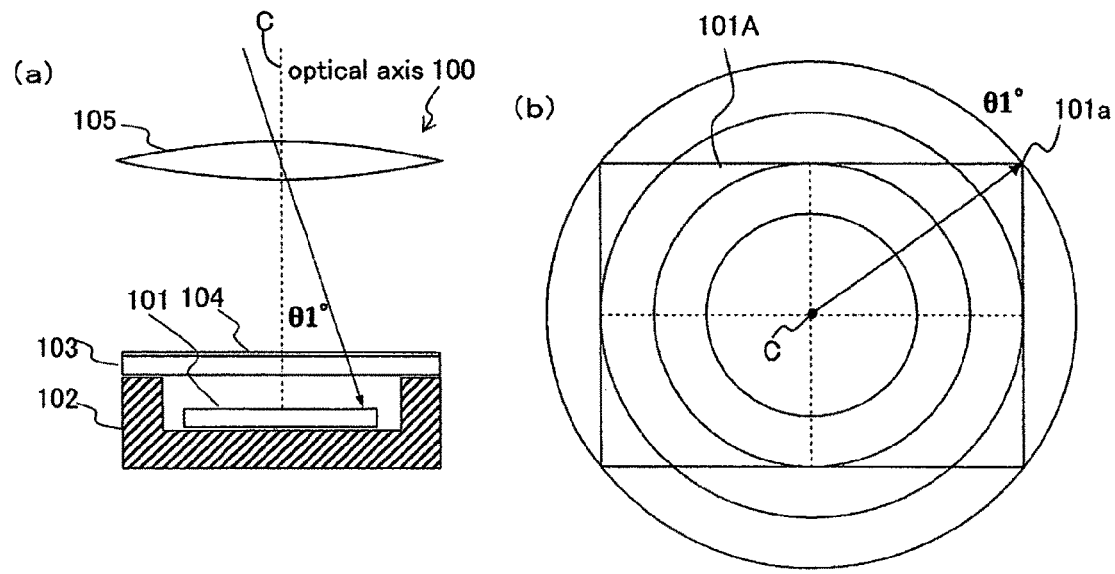
FIG. 5(a) is a schematic view illustrating a structure of a section of the conventional color image-capturing system disclosed in Reference 1.
FIG. 5(b) is a schematic view illustrating a plan structure of a light receiving surface of an image sensor in FIG. 5(a).
Figure 6:
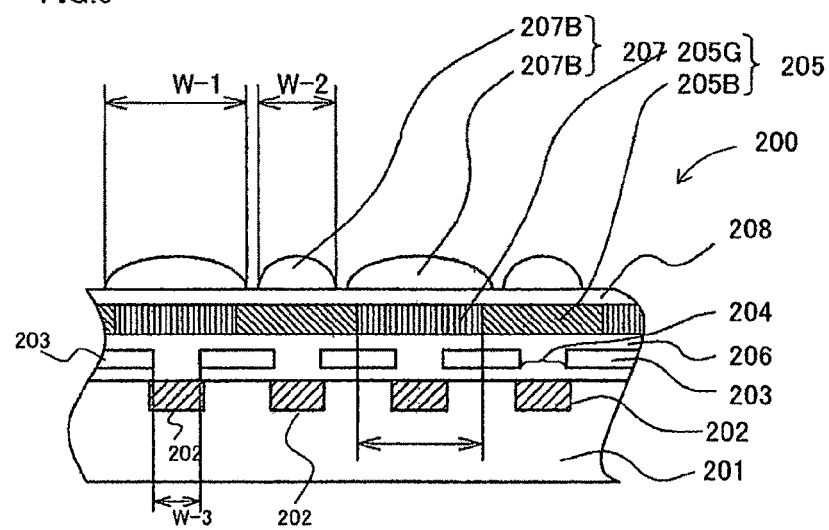
FIG. 6 is a main part cross sectional view of a conventional solid-state image capturing device disclosed in Reference 2.

In regard to the color arrangement for the color filters 14, Bayer arrangement is illustrated as an example, where a color arrangement of three primary colors of red (R), green in an R row (Gr), green in a B row (Gb), and blue (B) is repeated in a 2×2 pixel unit. Further, as described in FIG. 5(a), an interference-type infrared cut filter 104 is provided so as to suppress unnecessary sensitivity in an infrared area. When the interference-type infrared cut filter 104 is provided, an infrared cut wavelength shifts towards the short wavelength side as the position shifts from the center section to the periphery side of the light receiving surface. In order to control such a shift, the size (or light focusing ratio; the size being in proportion to a diameter or area) of the microlens 16 of an R pixel is formed in such a manner to successively or incrementally increase from the center section to the periphery section of the light receiving surface. That is, the size d11 of the microlenses 16 of Gb, Gr and B pixels are the same regardless of the position of the light receiving surface, whereas the diameter of the microlens 16 of the R pixel expands from the size d11 to the size d12 as the position moves further away from the center section (position of the optical axis C) of the light receiving surface to the periphery section of the light receiving surface. As a result, an output color signal is maintained constant, and the ratio of each color signal is maintained constant in a 2×2 pixel unit. That is, a fixed period of the plurality of color filters 14 is defined as a unit, and the size (or light focusing ratio; the size being in proportion to a diameter or area) of the plurality of microlenses 16 is variable for each photoelectric conversion section 12 such that the ratio of a plurality of color signals will be constant in a 2×2 pixel unit. Showing such a variation in a spectral transmittance characteristic diagram illustrating the distribution of the color signal intensity from the center section to the periphery section of the light receiving surface at the time of receiving uniform light, FIG. 1(e) prior to the countermeasure of Embodiment 1, is improved and turns to be FIG. 1(f). Herein, FIG. 1(e) illustrates a case where Embodiment 1 is not applied (conventional technique). FIG. 1(f) illustrates a case where Embodiment 1 is applied. The color signal intensity is corrected such that the color signal intensity will be the same in the center section by white balance. That is, a red level (red signal intensity) is not lowered in the periphery section of the light receiving surface by the application of Embodiment 1, thereby obtaining a uniform image with the suppressed color shading. In such a case, the ratios of a plurality of color signals are red (R)/green (G), green (G)/blue (B), blue (B)/red (R), and are constant in the entire image capturing area.

It is possible to increase the size (diameter or area) of the microlens 16 of the R pixel successively or incrementally from the center section to the periphery section of the light receiving surface by controlling the size at the precision of nanometer for each pixel unit at the time of designing a mask for forming a microlens.

As a further description, when a specific shape, namely a color shading of Fij (x, y) occurs, the color shading can be corrected by setting the size of the microlens as the size in proportion to 1/Fij (x, y), thereby suppressing the color shading. In such a case, when all the sizes of the plurality of microlenses are equal but the ratio of a plurality of color signals is not constant and Fij (x, y)=Ci (x, y)/Cj (x, y) occurs as a distribution, the size of the microlens for each light receiving section can be set to be the size in proportion to 1/Fij (x, y). However, (x, y) can be set as unit x, y coordinates of a space period of the color filter, and i and j can be set to be a number to express the type of the color filter.

In FIG. 1, the microlens 16 is a partially spherical shape. The center section of the light receiving surface (or the center section of the light receiving surface and the neighborhood area) has a gap between adjacent microlenses 16, and the circumference edges touch each other at the periphery sections of the light receiving surface. In this case, the bottom of the microlens 16 does not cover the entire pixel surface, and the light focusing ratio cannot be increased. Embodiment 2 describes a case where the light focusing ratio is increased by reducing the gap between adjacent microlenses 16 as much as possible.

Embodiment 2

Figure 2:
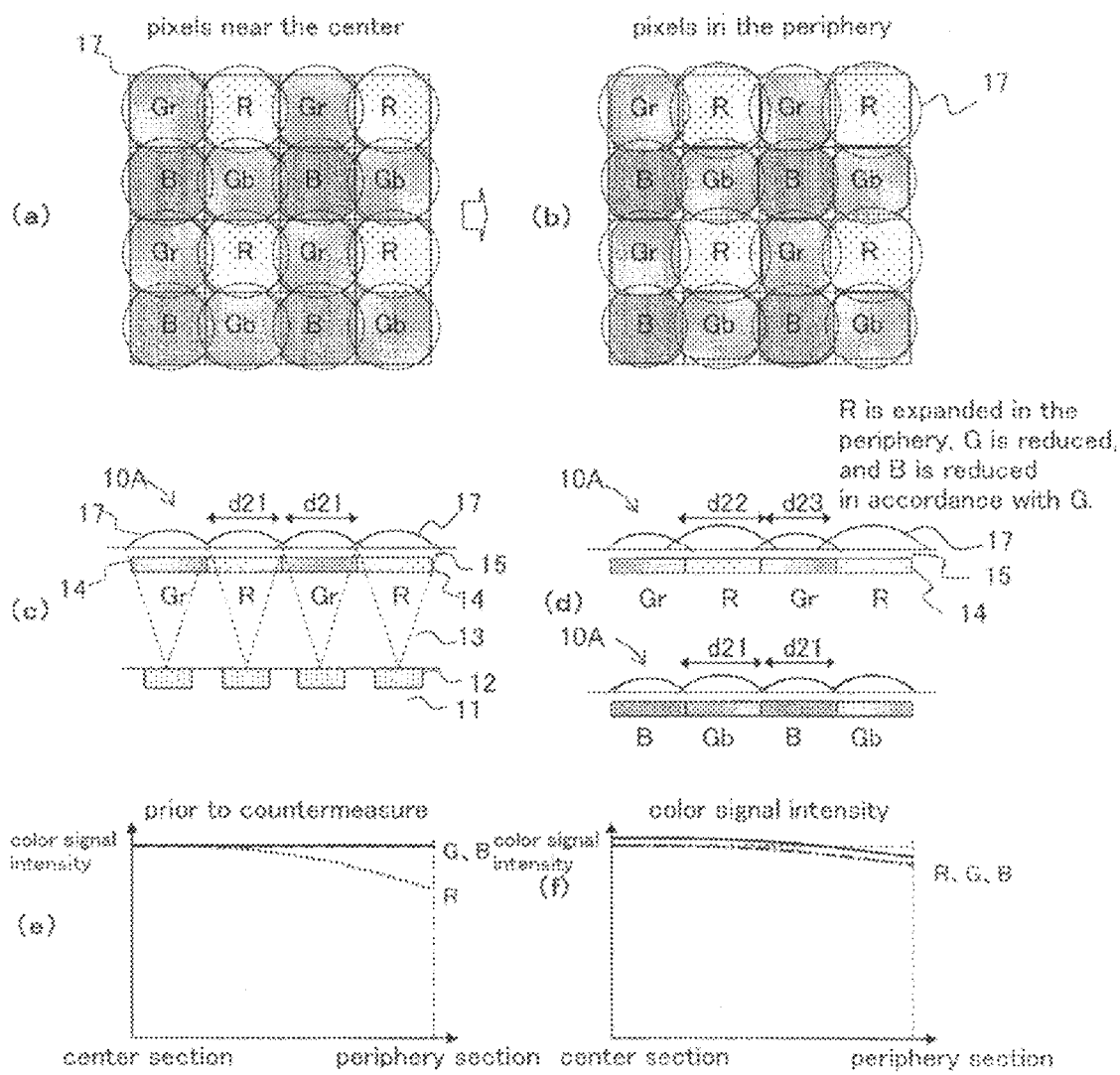
FIGS. 2(a) and 2(b) are plan views schematically illustrating Embodiment 2 of the color solid-state image capturing apparatus of the present invention.
FIGS. 2(c) and 2(d) are cross sectional views schematically illustrating the color solid-state image capturing apparatus.
FIGS. 2(e) and 2(f) are distribution charts of a color signal intensity prior and subsequent to the countermeasure according to Embodiment 2.

FIG. 2 is a plan view of microlenses corresponding to respective colors near the center section of the light receiving surface as an exemplary essential configuration of Embodiment 2 of the color solid-state image capturing apparatus of the present invention. FIG. 2(b) is a plan view of microlenses corresponding to respective colors near the periphery section of the light receiving surface. FIG. 2(c) is a longitudinal cross sectional view of FIG. 2(a) in a horizontal direction. FIG. 2(d) is a longitudinal cross-sectional view of FIG. 2(b) in a horizontal direction. FIG. 2(e) is a distribution chart of a color signal intensity prior to the countermeasure according to Embodiment 2. FIG. 2(f) is a distribution chart of a color signal intensity subsequent to the countermeasure according to Embodiment 2.

In FIGS. 2(a) to 2(d), a color solid-state image capturing apparatus 10A according to Embodiment 2 is provided with a plurality of photoelectric conversion sections 12 (light receiving section or light receiving element) of an N-type region with a predetermined space in a two dimensional matrix, in a P-type well region (not shown) provided on an N-type semiconductor substrate 11. Thus, the plurality of photoelectric conversion sections 12 are arranged with an equal pitch in a horizontal direction and a vertical direction (row and column directions) in the entire light receiving surface of an image capturing area. A surface P+ layer (not shown) for preventing dark current is provided on the surface of the photoelectric conversion section 12, and a light receiving element (photodiode) has an embedded structure. A color filter 14 and a microlens 17 on a planarization film 15 are provided in a corresponding manner to each photoelectric conversion section 12 via an interlayer insulation film 13 on each of the photoelectric conversion sections 12. Incident light is focused on each of the photoelectric conversion sections 12 from each microlens 17 via a color filter 14 of each color.

The microlens is a partially spherical shape, and has a configuration to overlap with an adjacent microlens at the periphery sections in the center section of the light receiving surface. There is a predetermined thickness at the borderline of adjacent microlenses in a plan view. In this case, compared to the case in Embodiment 1, a space between the microlenses can be reduced and the bottom of the microlens 17 covers the majority of the pixel surface, thereby increasing the light focusing ratio. Similar to the case in Embodiment 1 described above, an infrared rays cut filter 104 formed by a dielectric multilayer film is provided in order to suppress unnecessary sensitivity in the infrared area. When the interference-type infrared cut filter 104 is provided, an infrared cut wavelength shifts towards the short wavelength side as the position shifts from the center section to the periphery side of the light receiving surface of the image capturing area. In order to control such a shift, the size (or light focusing ratio; the size being in proportion to a diameter or area) of the microlens 17 of an R pixel is formed in such a manner to successively or incrementally increase from the center section to the periphery section of the light receiving surface. As a result, the size (or light focusing ratio; the size being in proportion to a diameter or area) of the microlens 17 of adjacent green color Gr pixel decreases accordingly. That is, the size d21 of the microlenses 17 of Gb, Gr and B pixels are the same regardless of the position of the light receiving surface, whereas the diameter of the microlens 17 of the R pixel expands from the size d21 to the size d22 as the position moves further away from the center section (position of the optical axis C) of the light receiving surface to the periphery section of the light receiving surface. Accordingly, the diameter of the microlens 17 reduces from the size d21 to the size d23. Thus, as illustrated in FIG. 2(*b*), the size (or light focusing ratio; the size being in proportion to a diameter or area) of the microlens 17 of the R pixel increases, and at the same time, the size (or light focusing ratio; the size being in proportion to a diameter or area) of the microlens 17 of the B pixel decreases. For the color signal of a pixel output, the size (or light focusing ratio; the size being in proportion to a diameter or area) can be set such that all the color signals decrease at the same rate. As a result, the ratio of each color signal is maintained constant in a 2×2 pixel unit. That is, a fixed period of the plurality of color filters 14 is defined as a unit, and the size (or light focusing ratio; the size being in proportion to a diameter or area) of the plurality of microlenses 17 is variable for each photoelectric conversion section 12 such that the ratio of a plurality of color signals will be constant in a 2×2 pixel unit. Showing such a variation in a spectral transmittance characteristic diagram illustrating the distribution of the color signal intensity from the center section to the periphery section of the light receiving surface at the time of receiving uniform light, FIG. 2(*e*) prior to the countermeasure of Embodiment 1 is improved and turns to be FIG. 2(*f*). Herein, FIG. 2(*e*) illustrates a case where Embodiment 2 is not applied (conventional technique). FIG. 2(*f*) illustrates a case where Embodiment 2 is applied. The color signal intensity is corrected such that the color signal intensity will be the same in the center section by white balance. That is, a red level (red signal intensity) is not lowered in the periphery section of the light receiving surface by the application of Embodiment 1, thereby obtaining a uniform image with the suppressed color shading. In such a case, the ratios of a plurality of color signals are red (R)/green (G), green (G)/blue (B), blue (B)/red (R), and are constant in the entire image capturing area.

Embodiment 3

In Embodiments 1 and 2 described above, it has been described that the size of the microlens for the light receiving surface is expanded as the position moves further away from the center section to the periphery section of the light receiving surface of the image capturing area in order to improve the fact that the infrared cut wavelength of a dielectric multilayer film shifts towards the short wavelength side as the incident angle of light increases and the color signal of the R pixel decreases in the periphery section of the light receiving surface of the image capturing area. In Embodiment 3, a case will be described where, in order to improve the fact that a color signal intensity of a Gb pixel decreases in the left and right edge sections of the light receiving surface of the image capturing area and a color signal intensity of a Gr pixel decreases in the upper and lower edge sections of the light receiving surface of the image capturing area in a specific color arrangement of color filters such as Bayer arrangement, the size (or light focusing ratio; the size being in proportion to a diameter or area) of the microlens corresponding to a color filter for a green color Gb pixel is increased from the center section to the left edge section and/or the right edge section in a horizontal direction (row direction) of the light receiving surface of the image capturing area (as the distance increases concentrically from the position of the optical axis), and the size (or light focusing ratio; the size being in proportion to a diameter or area) of the microlens corresponding to a color filter for a green color Gr pixel is increased from the center section to the upper edge section and/or the lower edge section in a perpendicular direction (column direction) of the light receiving surface of the image capturing area (as the distance increases concentrically from the position of the optical axis).

Figure 3:
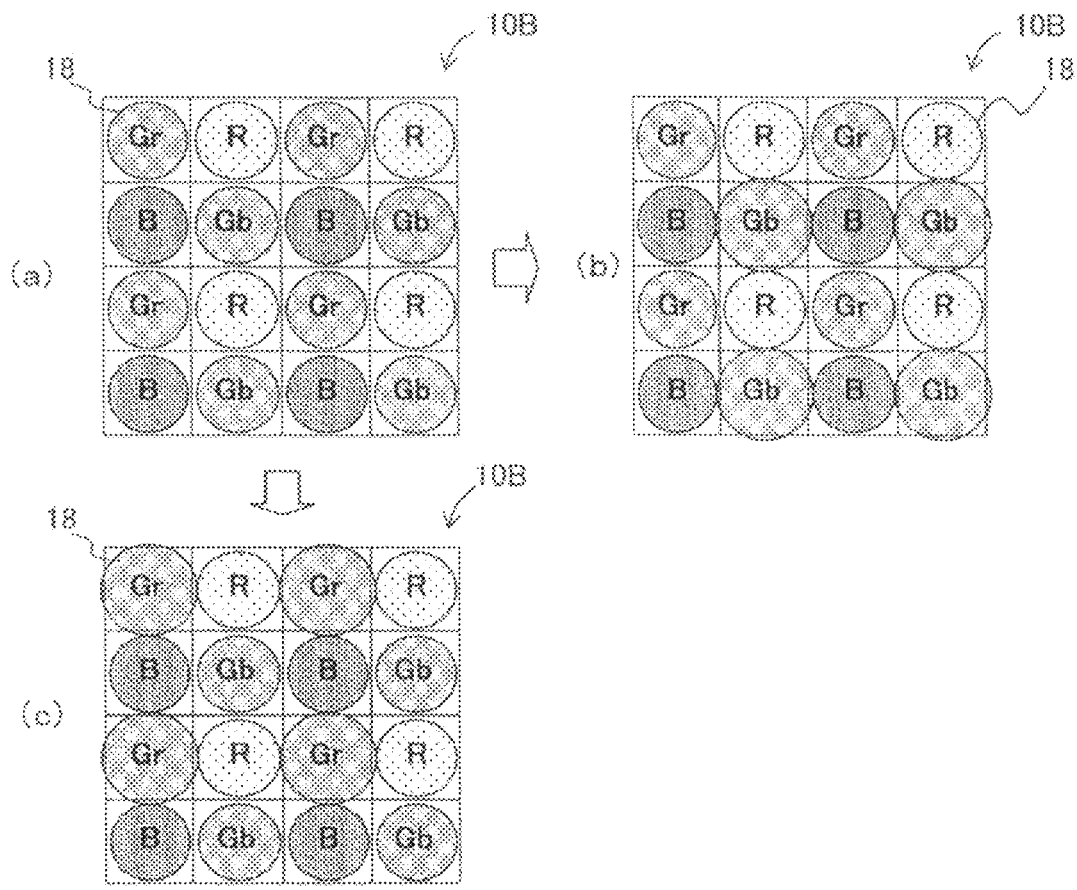
FIGS. 3(a) to 3(c) are plan views schematically illustrating Embodiment 3 of the color solid-state image capturing apparatus of the present invention.

FIG. 3 is a plan view schematically illustrating Embodiment 3 of the color solid-state image capturing apparatus of the present invention. FIG. 3(*a*) is a plan view of microlenses corresponding to respective colors near the center section of the light receiving surface. FIG. 3(*b*) is a plan view of microlenses corresponding to respective colors near the periphery section in the left or right direction of the light receiving surface. FIG. 3(*c*) is a plan view of microlenses corresponding to respective colors near the periphery section in the upper or lower direction of the light receiving surface. The longitudinal cross sectional configuration of Embodiment 3 is similar to the longitudinal cross sectional configuration of Embodiments 1 and 2 described above, and therefore, the same reference numerals are used for explanation for the members that have the same function and effect as the members used in FIG. 1(*c*).

In FIGS. 3(*a*) to 3(*c*), a color solid-state image capturing apparatus 10B according to Embodiment 3 is provided with a plurality of photoelectric conversion sections 12 (light receiving section or light receiving element) of an N-type region with a predetermined space in a two dimensional matrix, in a P-type well region (not shown) provided on an N-type semiconductor substrate 11. Thus, the plurality of photoelectric conversion sections 12 are arranged with an equal pitch in a horizontal direction and a vertical direction (row and column directions) in the entire light receiving surface of an image capturing area. A surface P+ layer (not shown) for preventing dark current is provided on the surface of the photoelectric conversion section 12, and a light receiving element (photodiode) has an embedded structure. A color filter 14 and a microlens 18 on a planarization film 15 are provided in a corresponding manner to each photoelectric conversion section 12 via an interlayer insulation film 13 on each of the photoelectric conversion sections 12. Incident light is focused on each of the photoelectric conversion sections 12 from each microlens 18 via a color filter 14 of each color.

The microlens 18 is defined as a partially spherical shape including a spherical shape of the best light focusing efficiency. The microlens has the following configurations. In the center section of the light receiving surface illustrated in FIG. 3(*a*), a gap exists between adjacent microlenses 18. In the left and right edge sections of the light receiving surface illustrated in FIG. 3(*b*), the microlenses 18 of the green Gb pixel are expanded to be touched at the lens periphery sections. In the upper and lower edge sections of the light receiving surface illustrated in FIG. 3(*c*), the microlenses 18 of the green Gr pixel are expanded to be touched at the lens periphery sections. That is, moving from a portion (width of a predetermined area of an edge portion in FIG. 8; the predetermined area equals to the width of a color shading area) of the center section in top and bottom direction of the light receiving surface of the image capturing area to the left or right edge section in a horizontal direction (row direction), the size (or light focusing ratio; the size being in proportion to a diameter or area) of the microlenses 18 corresponding to a green color Gb pixel color filter among a plurality of color filters 14 is successively or incrementally increased so that the microlenses 18 touch each other at the periphery sections. At the same time, moving from a portion (width of a predetermined area of an edge portion in FIG. 8; the predetermined area equals to the width of a color shading area) of the center section in left and right direction of the light receiving surface of the image capturing area to the upper or lower edge section in a perpendicular direction (column direction), the size (or light focusing ratio; the size being in proportion to a diameter or area) of the microlenses 18 corresponding to a green color Gr pixel color filter among the plurality of color filters 14 is successively or incrementally increased so that the microlenses 18 touch each other at the periphery sections. As a result, the color shading is corrected at the time of irradiating uniform light as illustrated in FIG. 7, thereby obtaining a uniform image. In this case, the ratios of a plurality of color signals are red (R)/green (Gr), green (Gr)/blue (B), blue (B)/green (Gb), and green (Gb)/red (R), and are constant in the entire image capturing area. In addition, the ratios of a plurality of color signals may be the same in red (R)/green (Gr), green (Gr)/blue (B), blue (B)/green (Gb), and green (Gb)/red (R), and may be constant respectively.

Although not explained in particular, it is possible to overlap the microlenses 18 with each other in the case of FIG. 3 of Embodiment 3 as similar to the case of FIG. 2 of Embodiment 2. In such a case, it is also possible to have a configuration where the microlenses 18 adjacent to each other at least at the center section of the light receiving surface of the image capturing area overlap each other at the lens periphery section. There is a predetermined thickness at the borderline of adjacent microlenses in a plan view. In order to completely fill the space between the lenses, the shape of the microlens in a plan view may be a quadrilateral, such as a rectangle and a square, other than a circle and an ellipse. When the microlens is a quadrilateral, the space between the lenses can be completely filled, thereby improving the light focusing efficiency.

In addition, it is possible to combine Embodiment 3 to either Embodiment 1 or 2 described above. This can be done in the case where the infrared cut filter is positioned and the specific color arrangement of the color filters is the Bayer arrangement. In this case, the size of the microlens for the light receiving surface is expanded as the position moves further away from the center section to the periphery section of the light receiving surface of the image capturing area in order to improve the fact that the infrared cut wavelength of a dielectric multilayer film shifts towards the short wavelength side as the incident angle of light increases and the color signal of the R pixel decreases in the periphery section of the light receiving surface of the image capturing area. At the same time, in order to improve the fact that a color signal intensity of a Gb pixel decreases in the left and right edge sections of the light receiving surface of the image capturing area and a color signal intensity of a Gr pixel decreases in the upper and lower edge sections of the light receiving surface of the image capturing area in a specific color arrangement of color filters such as Bayer arrangement, the size (or light focusing ratio; the size being in proportion to a diameter or area) of the microlens corresponding to a color filter for a green color Gb pixel is increased from the center section to the left edge section and/or the right edge section in a horizontal direction (row direction) of the light receiving surface of the image capturing area, and the size (or light focusing ratio; the size being in proportion to a diameter or area) of the microlens corresponding to a color filter for a green color Gr pixel is increased from the center section to the upper edge section and/or the lower edge section in a perpendicular direction (column direction) of the light receiving surface of the image capturing area (as the distance increases concentrically from the position of the optical axis). As a result, respective color shading phenomena, which occurs due to the positioning of the infrared cut filter and the specific color arrangement of color filters, can be simultaneously suppressed.

In such cases, G filters adjacent left and right of an R filter expand at the left and right edges of the light receiving surface, and G filters adjacent top and bottom of an R filter expand at the upper and lower edges of the light receiving surface. However, Gr and Gb may be optionally at the either position (may change places with each other).

Embodiment 4

According to Embodiment 4, the color solid-state image capturing apparatuses 10, 10A and 10B according to Embodiments 1 to 3 described above can be applied to any of a CMOS image sensor and a CCD image sensor, the color solid-state image capturing apparatuses being configured to have microlenses, such as the microlenses 16 to 18, corresponding to the color with a weak color signal intensity due to the occurrence of the color shading, the microlenses having an expanded size (diameter or area) from the center section of the light receiving surface to the periphery section of the light receiving surface. Such a case with a CMOS image sensor or CCD image sensor will be described.

In the CMOS image sensor, a signal readout circuit is provided for each unit pixel section. The signal readout circuit is connected to other signal readout circuits by a multilayer wiring layer and is related to selecting a photoelectric conversion section 12 and outputting a signal from the photoelectric conversion section 12. Although not illustrated herein, the signal readout circuit includes: a selection transistor for selecting a predetermined photoelectric conversion section 12 among the plurality of photoelectric conversion sections 12 arranged in a matrix on the side of an n-type semiconductor substrate 11; an amplifying transistor connected to the selection transistor in series, for amplifying a signal in accordance with a signal voltage converted from a signal charge transferred from the selected photoelectric conversion section 12 via a transfer transistor to a charge detection section (floating diffusion FD); and a reset transistor for resetting an electric potential of the charge detection section to a predetermined electric potential subsequent to the output of the signal from the amplifying transistor. Alternatively, although not illustrated herein, a signal readout circuit, which has another configuration without the selection transistor, includes: an amplifying transistor for amplifying a signal in accordance with a signal voltage converted from a signal charge transferred from the photoelectric conversion section 12 selected from peripheral circuits via a transfer transistor to a charge detection section among the plurality of photoelectric conversion sections 12 arranged in a matrix on the side of an n-type semiconductor substrate 11; and a reset transistor for resetting an electric potential of the charge detection section to a predetermined electric potential subsequent to the output of the signal from the amplifying transistor.

Although not illustrated herein either, in the CCD image sensor, a plurality of photoelectric conversion sections 12 are provided in two dimensions on a light receiving surface of an image capturing area. A signal charge photoelectrically converted in the photoelectric conversion section 12 is read out to a charge transfer section CCD and successively transferred in a predetermined direction. Subsequently, the signal charge is detected at once by the charge detection section, instead of being detected at each light receiving section. The signal charge is subsequently amplified as an image capturing signal to be outputted.

Herein, the characteristics of the CMOS image sensor and the CCD image sensor will be briefly described.

The CMOS image sensor does not use a CCD for transferring a signal charge from each light receiving section with a vertical transfer section and transferring the signal charge from the vertical transfer section in a horizontal direction with a horizontal transfer section, unlike the CCD image sensor. Instead, the CMOS image sensor reads out a signal charge from the light receiving section for each pixel with a selection control line formed by an aluminum wiring like a memory device and converts the signal charge into voltage. Subsequently, the CMOS image sensor successively reads out an imaging signal amplified in accordance with the converted voltage from a selected pixel. On the other hand, the CCD image sensor requires a plurality of positive and negative power supply voltages for driving a CCD, whereas the CMOS image sensor is capable of driving itself with a single power supply, which enables a low electric consumption and low voltage driving compared with the CCD image sensor. Further, because a unique CCD manufacturing process is used for manufacturing the CCD image sensor, it is difficult to apply a manufacturing process generally used for a CMOS circuit directly to the manufacturing method for the CCD image sensor. On the other hand, the CMOS image sensor uses a manufacturing process generally used for the CMOS circuit. Therefore, a logic circuit, an analog circuit and an analog-digital conversion circuit and the like can be simultaneously formed by the CMOS process that is frequently used for manufacturing a driver circuit for controlling a display, a driver circuit for controlling image capturing, a semiconductor memory such as DRAM, and a logic circuit. That is, it is easy to form a CMOS image sensor on a same semiconductor chip on which a semiconductor memory, a driver circuit for controlling a display, and a driver circuit for controlling image capturing are formed. In addition, with respect to the manufacturing for the CMOS image sensor, it is easy for the CMOS image sensor to share a production line with the semiconductor memory, the driver circuit for controlling a display, and the driver circuit for controlling image capturing.

Embodiment 5

Figure 4:
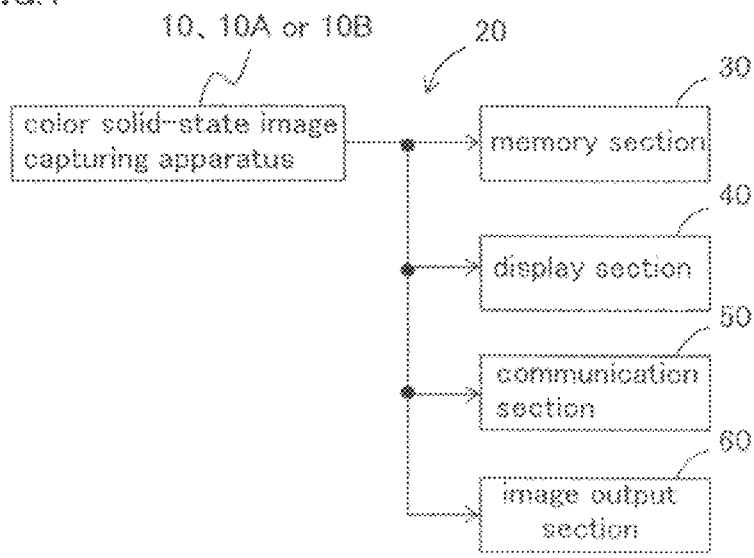
FIG. 4 is a block diagram illustrating an exemplary diagrammatic structure of an electronic information device of Embodiment 5 of the present invention, using the color solid-state image capturing apparatus according to any of Embodiments 1 to 4 of the present invention as an image input device in an image capturing section.

FIG. 4 is a block diagram illustrating an exemplary diagrammatic structure of an electronic information device of Embodiment 5 of the present invention, using the color solid-state image capturing apparatus according to any of Embodiments 1 to 4 of the present invention as an image input device in an image capturing section.

In FIG. 4, the electronic information device 20 according to Embodiment 5 of the present invention includes: either of the color solid-state image capturing apparatus 10, 10A or 10B according to Embodiments 1 to 3 for performing predetermined signal processing on an image capturing signal obtained from a signal charge read out from each photoelectric conversion section 12 so as to produce a color image signal; a memory section 30 (e.g., recording media) for data-recording the color image signal from the color solid-state image capturing apparatus 10, 10A or 10B after a predetermined signal process is performed on the color image signal for recording; a display section 40 (e.g., a color liquid crystal display apparatus) for displaying the color image signal from the color solid-state image capturing apparatus 10, 10A or 10B on a display screen (e.g., liquid crystal display screen) after predetermined signal processing is performed on the color image signal for display; a communication section 50 (e.g., a transmitting and receiving device) for communicating the color image signal from the color solid-state image capturing apparatus 10, 10A or 10B after predetermined signal processing is performed on the color image signal for communication; and an image output section 60 for printing the color image signal from the color solid-state image capturing apparatus 10, 10A or 10B after predetermined signal processing is performed for printing. Thus, the electronic information device 20 according to Embodiment 5 may include all of the memory section 30, the display section 40, the communication section 50, and the image output section 60. Without any limitations to this, the electronic information device may include at least any of these sections.

As the electronic information device 20, an electronic information device that has an image input device is conceivable, such as a digital camera (e.g., digital video camera and digital still camera), an image input camera (e.g., a monitoring camera, a door phone camera, a camera equipped in a vehicle (for back view or monitoring), and a television telephone camera), a scanner, a facsimile machine and a camera-equipped cell phone device.

Therefore, according to Embodiment 5 of the present invention, the color image signal from the color solid-state image capturing apparatus 10, 10A or 10B can be: displayed on a display screen finely, printed out on a sheet of paper using an image output apparatus, communicated finely as communication data via a wire or a radio; and stored finely at the memory section 30 by performing predetermined data compression processing, and various data processes can be finely performed.

According to Embodiments 1 to 5 with the configuration described above, the color solid-state image capturing apparatus 10, 10A or 10B includes: the plurality of photoelectric conversion sections 12 (light receiving section) arranged in a matrix for performing photoelectric conversions on the light receiving surface of the image capturing area; the plurality of color filters 14 each having different spectral characteristic and arranged on each photoelectric conversion section 12 with a constant space period; and any of the microlenses 16 to 18 positioned on the color filter 14 as a pixel unit, and the color solid-state image capturing apparatus 10, 10A or 10B outputs a plurality of color signals in response to the plurality of color filters 14 of respective colors. When uniform light enters, the space period of the color filter 14 described above is defined as a unit, and the size (diameter or area) of the microlenses 16 to 18 described above can be variable for each pixel unit such that the ratio of each color signal will be constant in the unit. As a result, the color shading phenomenon of a specific shape caused due to various factors, such as the positioning of the infrared cut filter and a specific color arrangement of color filters, can be suppressed.

According to Embodiments 1 to 5, the plurality of color filters 14 are defined as Bayer arrangement composed of the color arrangement of primary colors of red (R), green (G) and blue (B). Without the limitation to this, the color arrangement may be composed of the color arrangement of complementary colors cyan (C), yellow (Y) and magenta (M). Accordingly, in Embodiments 1 and 2 described above, the infrared cut filter formed with a dielectric multilayer film is provided above the light receiving surface of the image capturing area, and the size of any of the microlenses 16 and 17 corresponding to a red filter among the plurality of color filters 14 is successively or incrementally increased from the center section towards the outside of the light receiving surface. Without limitation to this, the infrared cut filter formed with a dielectric multilayer film may be provided above the light receiving surface of the image capturing area, and the size of any of the microlenses 16 and 17 corresponding to a magenta filter of a red color line among the plurality of color filters 14 may be successively or incrementally increased from the center section towards the outside of the light receiving surface. As described above, when the size is increased incrementally, a constant period of the plurality of color filters is defined as a unit, and the size of the plurality of microlenses is variable for each light receiving section such that the ratio of the plurality of color signals will be constant in a predetermined unit.

As described above, the present invention is exemplified by the use of its preferred Embodiments 1 to 5. However, the present invention should not be interpreted solely based on Embodiments 1 to 5 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 5 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a color solid-state image capturing apparatus having a photoelectric conversion section (which is defined as a light receiving section corresponding to each pixel) configured with a semiconductor element (photodiode), which performs photoelectric conversions on and capturing incident light from a subject for each pixel, and a plurality of microlenses for focusing incident light through corresponding color filters of respective colors on corresponding light receiving sections; and an electronic information device, such as a digital camera (e.g., digital video camera and digital still camera), an image input camera, a scanner, a facsimile machine, and a camera-equipped cell phone device used in an image capturing section as an image input device. According to the present invention with the configuration described above, a fixed period of a plurality of color filters is defined as a unit. A size (or light receiving ratio; in proportion to diameter or area) of a plurality of microlenses is variable for each light receiving section such that the ratio of a plurality of color signals will be constant within the unit. As a result, the color shading phenomenon of a specific shape, which is caused by various factors such as the positioning of the infrared cut filter and the specific color arrangement of color filters, can be suppressed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A color solid-state image capturing apparatus in which a plurality of light receiving sections for performing photoelectric conversions are arranged in a matrix on a light receiving surface of an image capturing area, a plurality of color filters each having a different spectral characteristic are positioned in a constant period above the plurality of light receiving sections in a corresponding manner to each of the plurality of light receiving sections, and a plurality of microlenses for focusing light on the plurality of respective light receiving sections are positioned on the plurality of color filters, and a plurality of color signals are output in accordance with the plurality of color filters,
wherein the constant period of the plurality of color filters is defined as a unit, and the size of the plurality of microlenses is variable for each light receiving section so that the ratio of the plurality of color signals is constant in the unit; and
wherein the ratio of the plurality of color signals is red (R)/green (G), green (G)/blue (B), and blue (B)/red (R), and the ratio is constant in the entire image capturing area.

2. A color solid-state image capturing apparatus according to claim 1, wherein the plurality of light receiving sections each have the same area in a plan view and are arranged with an equal pitch in a horizontal direction and a perpendicular direction on the light receiving surface of the image capturing area.

3. A color solid-state image capturing apparatus according to claim 1, wherein the plurality of color filters have a color arrangement of primary colors.

4. A color solid-state image capturing apparatus according to claim 3, wherein the plurality of color filters are composed of the primary colors of red (R), green (G) and blue (B).

5. A color solid-state image capturing apparatus according to claim 3, wherein the color arrangement of primary colors is Bayer arrangement.

6. A color solid-state image capturing apparatus according to claim 1, wherein an infrared cut filter is provided above the light receiving surface of the image capturing area, and the size or light focusing ratio of the microlens corresponding to a red filter among the plurality of color filters is increased successively or incrementally.

7. A color solid-state image capturing apparatus according to claim 1, wherein the plurality of microlenses each have a partially spherical shape.

8. A color solid-state image capturing apparatus according to claim 1, wherein at least adjacent sections of circumference edge sections of adjacent microlenses overlap each other at the circumference in at least a periphery section of the light receiving surface among from the center section of the light receiving surface to the periphery section of the light receiving surface.

9. A color solid-state image capturing apparatus according to claim 5, wherein the size or light focusing ratio of the microlens corresponding to a green Gb pixel filter among the plurality of color filters is successively or incrementally increased from a portion of the center section in a top and bottom direction of the light receiving surface to a left edge section and a right edge section, so that at least portions of respective adjacent lens periphery sections touch each other, and the size or light focusing ratio of the microlens corresponding to a green Gr pixel filter among the plurality of color filters is successively or incrementally increased from a portion of the center section in a left and right direction of the light receiving surface to an upper edge section and a lower edge section, so that at least portions of respective adjacent lens periphery sections touch each other.

10. A color solid-state image capturing apparatus according to claim 5,
wherein an infrared cut filter is provided above the light receiving surface of the image capturing area, and the size or light focusing ratio of the microlens corresponding to a red filter among the plurality of color filters is increased successively or incrementally from the center section of the light receiving surface towards the outside,
wherein the size or light focusing ratio of the microlens corresponding to a green Gb pixel filter among the plurality of color filters is increased successively or incrementally from a portion of the center section in a top and bottom direction of the light receiving surface to a left edge section and a right edge section, so that at least portions of adjacent lens circumference sections touch each other, and wherein the size or light focusing ratio of the microlens corresponding to a green Gr pixel filter among the plurality of color filters is increased successively or incrementally from a portion of the center section in a left and right direction of the light receiving surface to an upper edge section and a lower edge section, so that at least portions of adjacent lens circumference sections touch each other.

11. A color solid-state image capturing apparatus according to claim 1, wherein the expansion ratio of the size of the microlens is set to be a value for correcting the decreased amount of the light amount of a specific color or the decreased amount of a specific color signal intensity from the center section of the light receiving surface towards the outside.

12. A color solid-state image capturing apparatus according to claim 1, wherein a unit shape of the microlens in a plan view is either of a circle, ellipse, rectangle or square.

13. A color solid-state image capturing apparatus according to claim 1, wherein the color solid-state image capturing apparatus configures a CMOS image sensor or a CCD image sensor.

14. A color solid-state image capturing apparatus in which a plurality of light receiving sections for performing photoelectric conversions are arranged in a matrix on a light receiving surface of an image capturing area, a plurality of color filters each having a different spectral characteristic are positioned in a constant period above the plurality of light receiving sections in a corresponding manner to each of the plurality of light receiving sections, and a plurality of microlenses for focusing light on the plurality of respective light receiving sections are positioned on the plurality of color filters, and a plurality of color signals are output in accordance with the plurality of color filters, wherein the constant period of the plurality of color filters is defined as a unit, and the size of the plurality of microlenses is variable for each light receiving section so that the ratio of the plurality of color signals is constant in the unit; and wherein when the size of all the plurality of microlenses is equal and the ratio of the plurality of color signals is not constant producing $F_{ij}(x, y) = C_i(x, y)/C_j(x, y)$ as a distribution, the size of the microlens for each light receiving section is defined to be the size in proportion to $1/F_{ij}(x, y)$, wherein $(x, y)$ denotes unit x, y coordinates of the space period of the color filter, and i and j denotes numbers to express the type of the color filter.

15. An electronic information device using the color solid-state image capturing apparatus according to claim 1 as an image input device in an image capturing section.

* * * * *